(12) United States Patent
Nakajima et al.

(10) Patent No.: US 6,794,681 B2
(45) Date of Patent: Sep. 21, 2004

(54) SUBSTRATE OF SEMICONDUCTOR DEVICE AND FABRICATION METHOD THEREOF AS WELL AS SEMICONDUCTOR DEVICE AND FABRICATION METHOD THEREOF

(75) Inventors: Setsuo Nakajima, Kanagawa (JP); Shunpei Yamazaki, Tokyo (JP); Hisashi Ohtani, Kanagawa (JP); Satoshi Teramoto, Kanagawa (JP); Toshiji Hamatani, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 124 days.

(21) Appl. No.: 09/953,483

(22) Filed: Sep. 14, 2001

(65) Prior Publication Data

US 2002/0014626 A1 Feb. 7, 2002

Related U.S. Application Data

(63) Continuation of application No. 09/039,685, filed on Mar. 16, 1998, now Pat. No. 6,291,837.

(30) Foreign Application Priority Data

Mar. 18, 1997 (JP) .............................................. 9-084467
Mar. 24, 1997 (JP) .............................................. 9-090243
Apr. 24, 1997 (JP) .............................................. 9-121748

(51) Int. Cl.[7] ........................ H01L 29/04; H01L 31/036; H01L 29/76; H01L 31/112; H01L 23/158
(52) U.S. Cl. ............................ 257/72; 257/66; 257/635
(58) Field of Search ........................... 257/56–72, 79, 257/83, 84, 88, 635; 349/42–45; 438/22, 29, 30, 152, 155, 164

(56) References Cited

U.S. PATENT DOCUMENTS

| | | | |
|---|---|---|---|
| 4,851,363 A | | 7/1989 | Troxell et al. |
| 5,112,764 A | * | 5/1992 | Mitra et al. .................. 438/163 |
| 5,313,075 A | | 5/1994 | Zhang et al. |
| 5,418,393 A | * | 5/1995 | Hayden ...................... 257/347 |
| 5,424,244 A | | 6/1995 | Zhang et al. |
| 5,844,255 A | * | 12/1998 | Suzuki et al. .................. 257/59 |
| 5,946,561 A | | 8/1999 | Yamazaki et al. |
| 6,083,801 A | | 7/2000 | Ohtani |
| 6,160,272 A | | 12/2000 | Arai et al. |
| 6,268,617 B1 | | 7/2001 | Hirakata et al. |
| 6,384,818 B1 | | 5/2002 | Yamazaki et al. |
| 6,478,263 B1 | | 11/2002 | Yamazaki et al. |
| 6,528,820 B1 | | 3/2003 | Yamazaki et al. |

FOREIGN PATENT DOCUMENTS

| | | | | |
|---|---|---|---|---|
| EP | 0 532 314 A1 | * | 3/1993 | ....... H01L/21/3205 |
| JP | 58-134476 | * | 8/1983 | ........... H01L/29/78 |
| JP | 59-89436 | * | 5/1984 | ............. H01L/2/84 |

* cited by examiner

Primary Examiner—Shouxiang Hu
(74) Attorney, Agent, or Firm—Fish & Richardson P.C.

(57) ABSTRACT

There are provided a substrate of a semiconductor device and a fabrication method thereof which allow to suppress impurity from turning around from a glass or quartz substrate in fabrication steps of a TFT. An insulating film is deposited so as to surround the glass substrate by means of reduced pressure thermal CVD. It allows to suppress the impurity from infiltrating from the glass substrate to an active region of the TFT in the later process.

14 Claims, 14 Drawing Sheets

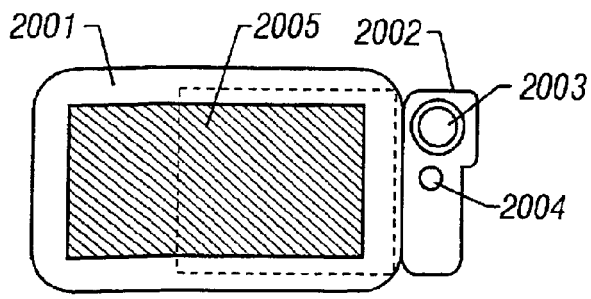
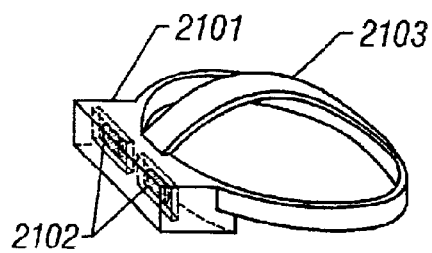
FIG. 10A
FIG. 10B
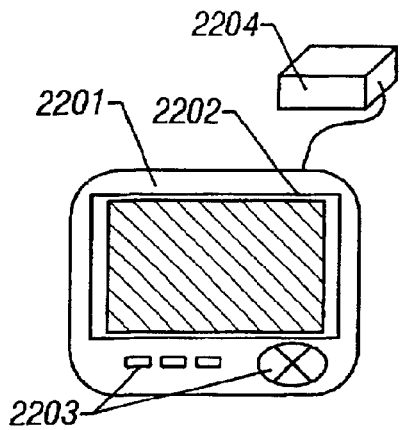
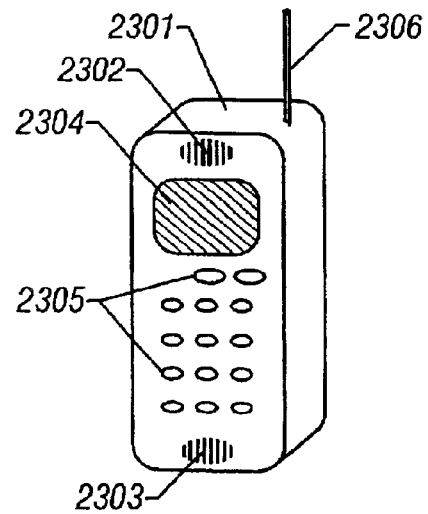
FIG. 10C
FIG. 10D
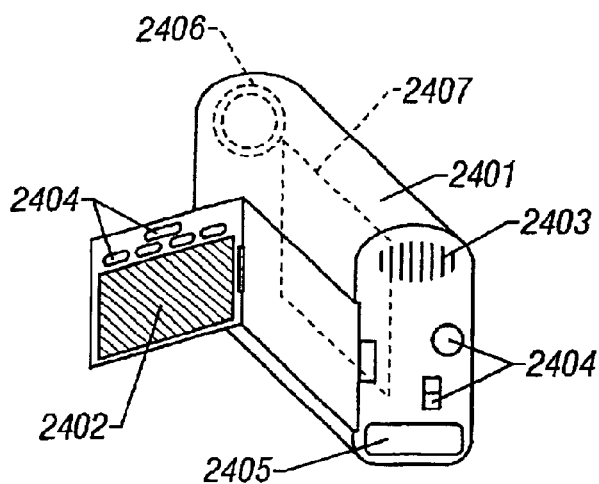
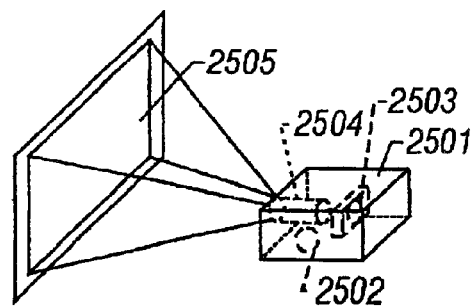
FIG. 10E
FIG. 10F

SUBSTRATE OF SEMICONDUCTOR DEVICE AND FABRICATION METHOD THEREOF AS WELL AS SEMICONDUCTOR DEVICE AND FABRICATION METHOD THEREOF This application is a continuation of Ser. No. 09/039,685 filed Mar. 16, 1998 now U.S. Pat. No. 6,291,837.

BACKGROUND OF THE INVENTION

1. Field of the Invention

The invention disclosed in the present specification relates to a substrate on which a thin film semiconductor device typified by a thin film transistor is formed and to a method for fabricating the substrate. The invention also relates to a thin film transistor formed on an insulating substrate such as a glass substrate and a quartz substrate and to a method for fabricating the same.

2. Description of Related Art

Hitherto, there has been known a technology for fabricating a thin film transistor (hereinafter referred to as a TFT) on a glass or quartz substrate. This technology is required to fabricate an active matrix type liquid crystal display.

Presently, the mainstream thereof is a-Si TFT using an amorphous silicon film. However, the a-SiTFT is applied only in constructing an active matrix circuit because its operating speed is slow.

A structure in which a peripheral driving circuit and other circuits, beside the active matrix circuit, are integrated on one glass substrate is being proposed lately. This structure is called a system-on-panel. The structure called the system-on-panel is a configuration required in miniaturizing and lightening an apparatus comprising the liquid crystal display. It is also useful to integrate the circuits having the various functions on one substrate in simplifying fabrication steps and operation checks.

When a TFT is fabricated on the insulating substrate such as the glass substrate or the quartz substrate however, its characteristic has been questionably low and varied. When the characteristic is low, characteristic of a circuit comprising such a TFT is also degraded. When the characteristic varies greatly, characteristic of a circuit comprising such a TFT varies and is degraded.

The grade of the characteristic is related mainly to physical properties of a semiconductor film to be used. The characteristic of the TFT may be enhanced by using a silicon film having high crystallinity.

Meanwhile, the variation and the instability of the characteristic of the TFT are considered to be caused by:

1) instability of process; and
2) electrical instability of a thin film semiconductor obtained.

The variation and the instability of the characteristic of the TFT of an active matrix liquid crystal display are considered to be caused by impurity mixed in steps for fabricating the TFT because:

1) a glass or quartz substrate containing impurity in high concentration as compared to a semiconductor substrate is used as a substrate in the active matrix type liquid crystal display; and
2) the size of a deposition system and a conveyor system increases in correspondence to the substrate having a relatively large area.

For instance, impurity mixed into a semiconductor film composing the TFT in steps for depositing it causes the variation and the instability of the TFT characteristic.

Then, the inventor et. al. have measured film quality and impurity of a gate insulating film which has a large influence on the characteristic of the TFT to study the above-mentioned relationship between the characteristic of the TFT and the variation.

FIG. 11 shows data concerning to impurity existing at the interface between a gate insulating film and a gate electrode of a TFT formed on a Corning 1737 glass substrate. This data is a result of the measurement carried out by means of EDX (energy distributed X-ray micro-analysis). EDX senses elements existing in the order of more than 0.1%. Accordingly, elements detected by the EDX analysis means to exist in the order of more than 0.1% (percentage of number of elements).

This sample is what a silicon oxide film deposited by means of plasma CVD is used as the gate insulating film and aluminum deposited by means of sputtering is used as the gate electrode.

Accordingly, peaks of silicon (Si), oxygen (O) and aluminum (Al) are seen in FIG. 11. However, peaks of trace amounts of barium (Ba) and calcium (Ca) are also seen.

Although the vertical axis of the measured value shown in FIG. 11 is not what reflects the percentage of elements accurately, it shows a relative relationship of the density of their existence.

While counted numbers of barium and calcium are not so large as compared to those of aluminum and silicon in FIG. 11, their density is considered to be high when their electrical influence is considered (they exist at least more than 0.1%.

Barium and calcium are liable to be ionized. Accordingly, such elements existing at the interface between the gate insulating film and the gate electrode with concentration of more than 0.1% may become a significant factor of destabilizing the operation of the TFT.

FIG. 12 shows a result of analysis of the Corning 1737 glass substrate utilized as a substrate implemented by the same measuring method with that shown in FIG. 11.

As it is apparent from FIG. 12, this glass substrate contains relatively high concentration of barium and calcium. It can be considered from this fact that barium and calcium shown in FIG. 11 are what have turned around from the glass substrate used as described above.

This turn-around of the impurity from the glass substrate is considered to have occurred when the substrate is sputtered in depositing the gate electrode, flying around the impurity within the ambient atmosphere.

Further, quartz is required to use as a substrate in implementing heat treatment in a temperature as high as 800° C. and 900° C. However, although a substrate composing a semiconductor device is required to have high impurity as described above, such a quartz substrate is expensive in general.

A number of ranks exists among quartz substrates and a quartz substrate in the lower rank is inexpensive. However, a quartz substrate in the lower rank contains high concentration of OH group and the OH group affects the operation of the semiconductor device fabricated on the substrate. For instance, it becomes a factor of shifting a threshold value of the TFT on the minus side.

In general, the OH group within the quartz substrate is a factor of destabilizing the operation of the semiconductor device fabricated on the substrate and of varying the characteristic of the device.

According to the measurement carried out by the inventors et. al. of the present invention, concentration of OH within the low grade quartz substrate has been higher than that of a higher grade quartz substrate by more than 15 times.

There has been known a crystal grass (called also as a ceramic glass) as an inexpensive glass substrate having a high heat resistance and a distortion point of 700° C. or more. However, because the crystallized glass substrate also has various components, it is feared that impurity may diffuse from the substrate in the process for manufacturing the semiconductor device.

Accordingly, based on the recognition described above, it is an object of the invention disclosed in the present specification to construct a substrate for a semiconductor device which allows a stable semiconductor device having no variation of characteristic to be obtained by preventing impurity from turning around to the semiconductor device from a glass or quartz substrate (or another adequate substrate), and to provide a method for fabricating such a substrate.

It is another object of the invention to provide a semiconductor device whose variation of characteristic and instability have been eliminated and to a method for fabricating such a semiconductor device.

SUMMARY OF THE INVENTION

In order to solve the above-mentioned problems, a glass or quartz substrate is used as a substrate of a semiconductor device according to the present invention. As the glass substrate, a Corning 1737 glass substrate, a 7059 glass substrate, an Neoselum N0 glass substrate, an N11 glass substrate and a crystallized glass (ceramic glass) substrate whose distortion point is 700° C. or more (typically about 950° C. to 1100° C.) may be used.

While there are various kinds of crystallized glass, basically aluminosilicate glass and boro-silicate glass mainly composed of quartz ($SiO_2$) and alumina ($Al_2O_3$) may be practically used. As a substrate of a semiconductor device, it is preferable to be a non-alkali glass. Mg—$Al_2O_3$—$SiO_2$ group, PbO—ZnO—$B_2O_3$ group, $Al_2O_3$—$B_2O$—$SiO_2$ group, ZnO—$B_2O_3$—$SiO_2$ group and the like are preferable. Specifically, it is required to use a high heat resistant substrate such as the quartz and crystallized glass substrate which can sustain high heating temperature.

(1) In order to solve the above-mentioned problems, according to an arrangement of the invention disclosed in the present specification, a substrate of a semiconductor device is a glass or quartz substrate which surrounding surface is covered by a blocking layer.

(2) According to another arrangement of the invention, a substrate of a semiconductor device comprises a glass or quartz substrate; a blocking layer formed so as to cover the surrounding surface of the substrate; and a silicon film formed so as to cover the blocking layer.

In the above-mentioned arrangements (1) or (2), a film selected from a silicon oxide film, a silicon nitride film and a silicon oxide nitride film is used as the blocking layer.

Further, a film represented as $Si_XC_{1-X}$ (0<X<1) may be used instead of the silicon film. Another semiconductor film may be also used.

(3) According to another arrangement of the invention, there is provided a method for fabricating a substrate of a semiconductor device, comprising steps of depositing a blocking layer on the surrounding surface of a glass or quartz substrate by means of reduced pressure thermal CVD; and depositing an amorphous silicon film so as to cover the blocking layer by means of reduced pressure thermal CVD.

(4) According to another arrangement of the invention, there is provided a method for fabricating a substrate of a semiconductor device, comprising steps of forming a blocking layer on the surrounding surface of a glass or quartz substrate by means of reduced pressure thermal CVD; and depositing an amorphous silicon film so as to cover the surrounding surface of the blocking layer by means of reduced pressure thermal CVD.

In the above-mentioned arrangements (3) and (4), a film selected from a silicon oxide film, a silicon nitride film and a silicon oxide nitride film may be used as the blocking layer.

Further, a film represented as $Si_XC_{1-X}$ (0<X<1) may be used instead of the silicon film. Another semiconductor film may be also used.

(5) According to a still other arrangement of the invention, there is provided a method for fabricating a semiconductor device, comprising steps of depositing an amorphous silicon film at least on a main surface of the substrate; transforming the amorphous silicon film into a thermal oxide film by heating in oxidizing atmosphere; and forming a thin film semiconductor device on the thermal oxide film.

As the substrate, typically a quartz or crystallized glass substrate may be used. The present invention is useful especially in using the crystallized glass or the lower grade quartz substrate.

At least the main surface means the face on which the thin film semiconductor device (e.g. a thin film transistor) is formed. It is possible to arrange such that the amorphous silicon film is deposited also on the back of the substrate and to transform it into a thermal oxide film as shown in an embodiment y.

The oxidizing atmosphere may include, for example:
(i) atmosphere of 100% of oxygen;
(ii) atmosphere containing halogen elements within the oxygen atmosphere; and
(iii) atmosphere containing oxygen and having an oxidizing effect.

Normally, normal pressure is used as pressure of the atmosphere. However, it may be put into a state of reduced pressure or a pressurized state. It is also possible to introduce moisture.

The thin film semiconductor device may be formed directly on the thermal oxide film. However, it may be structured by depositing an insulating film further. It is also possible to arrange such that a film having high thermal conductivity such as a carbon film or an aluminum nitride film is provided as a heat radiating layer and the semiconductor device is formed thereon.

(6) According to a still other arrangement of the invention, there is provided a method for fabricating a substrate of a semiconductor device, comprising steps of depositing an amorphous silicon film at least on main face of the substrate; and transforming the amorphous silicon film into a thermal oxide film by heating in oxidizing atmosphere.

The invention disclosed in the present specification is useful not only in the fabrication steps of the semiconductor device but also in the method for fabricating the substrate used in the semiconductor device.

In the arrangements (5) and (6), a substrate having heat resistance such as a quartz substrate and a crystallized glass substrate which can sustain the heat in forming the thermal oxide film may be used. Further, as the substrate, a low grade mono-crystal silicon substrate (mono-crystal silicon wafer) or a poly-crystal silicon substrate (poly-crystal silicon wafer) may be used.

(7) Further, in order to solve the above-mentioned problems, according to another arrangement of the invention disclosed in the present specification, there is provided a method for fabricating a semiconductor device, comprising steps of forming an insulating film on the exposed surrounding surface of a glass or quartz substrate by means of reduced pressure thermal CVD; depositing an amorphous silicide film so as to cover the insulating film by means of reduced pressure thermal CVD; depositing an insulating film having the same quality with the insulating film so as to cover the silicide film by means of reduced pressure thermal CVD; and completing a thin film transistor by using the insulating film deposited so as to cover the silicide film in the previous step as a gate insulating film.

(8) According to another arrangement of the invention, there is provided a method for fabricating a semiconductor device, comprising steps of depositing an insulating film on the exposed upper, back and side faces of a glass or quartz substrate by means of reduced pressure thermal CVD; depositing an amorphous silicide film so as to cover the insulating film by means of reduced pressure thermal CVD; depositing an insulating film having the same quality with the insulating film so as to cover the silicide film by means of reduced pressure thermal CVD; and completing a thin film transistor by using the insulating film deposited so as to cover the silicide film in the previous step as a gate insulating film.

As the amorphous silicide film, an amorphous silicon film or an amorphous film represented as $Si_xGe_{1-x}$ ($0 \leq X \leq 1$) may be used. As the blocking layer, a film selected from a silicon oxide film, a silicon nitride film and a silicon oxide nitride film may be used.

As a method for depositing the silicon oxide film, the reduced pressure thermal CVD using silane and oxygen or dichlorosilane and oxygen as original gases may be used.

As a method for depositing the silicon nitride film and the silicon oxide nitride film, the reduced pressure thermal CVD using silane and $N_2O$ or silane and $NO_2$ as original gases may be used. The silicon nitride film may be deposited by using the reduced pressure thermal CVD using dichlorosilane and ammonia.

Specifically, plasma CVD using dichlorosilane and ammonia has an effect that it allows a film having less defects to be formed because the defects within the film to be deposited are terminated by chlorine.

(9) According to another arrangement of the invention, there is provided a semiconductor device comprising a thin film transistor formed on one face of a glass substrate, wherein an insulating film composing a gate insulating film of the thin film transistor is deposited so as to surround the glass substrate.

(10) According to another arrangement of the invention, there is provided a semiconductor device comprising a thin film transistor formed on one face of a glass substrate, wherein an insulating film composing a gate insulating film of the thin film transistor is deposited also on the back of the glass substrate.

(11) According to another arrangement of the invention, there is provided a semiconductor device utilizing a thin film transistor formed on one face of a glass substrate, wherein an insulating film composing a gate insulating film of the thin film transistor is deposited also on the back of the glass substrate.

In the above-mentioned three arrangements (9) through (11) of the invention, the insulating film is deposited on the bottom face of an active layer composing the thin film transistor and is also deposited on the back of the glass substrate.

(12) According to another arrangement of the invention, there is provided a semiconductor device utilizing a thin film transistor formed on one face of a glass substrate, wherein an insulating film composing a gate insulating film of the thin film transistor has the same component with an insulating film deposited under an active layer of the thin film transistor and the insulating film is deposited also on the back of the glass substrate.

(13) According to another arrangement of the invention, there is provided a semiconductor device utilizing a thin film transistor formed on one face of a glass substrate, wherein an insulating film composing a gate insulating film of the thin film transistor has the same component with an insulating film deposited under an active layer of the thin film transistor and the insulating film deposited under the active layer is deposited so as to surround the glass substrate.

In the above-mentioned arrangement (13), it is effective to contain halogen element within the insulating film. For instance, chlorine may be included in the film in depositing the insulating film by using dichlorosilane. Concentration of the halogen element at this time is desirable to be less than 5 atom %.

The specific nature of the invention, as well as other objects, uses and advantages thereof, will clearly appear from the following description and from the accompanying drawings in which like numerals refer to like or corresponding parts.

BRIEF DESCRIPTION OF DRAWINGS

FIGS. 10A through 10F show an outline of apparatuses using a semiconductor device;

DESCRIPTION OF PREFERRED EMBODIMENTS

First Embodiment

Figure 1A:
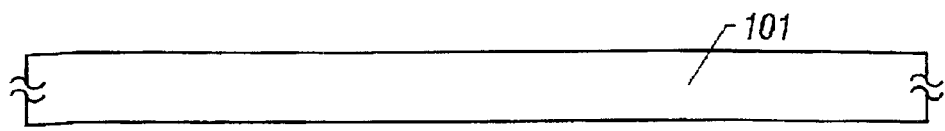
FIGS. 1A through 1E show steps for fabricating a glass substrate on which a crystal silicon film is deposited.

FIGS. 1A through 1E show fabrication steps of the present embodiment. At first, a glass substrate 101 is prepared as shown in FIG. 1A. Although a Corning 1737 glass substrate is used here, other glass substrates such as a Corning 7059 substrate may be used.

Figure 1B:
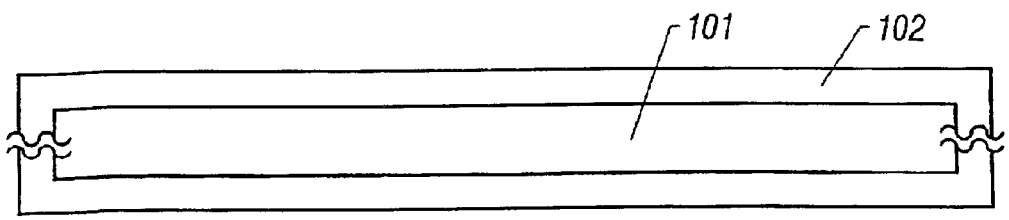

Next, a silicon oxide film 102 is deposited so as to have a thickness of 250 nm by means of reduced pressure thermal CVD. Here, the film is deposited by using $SiH_4$ and $NO_2$ as original gases and by heating in reduced pressure atmosphere at 600° C. Preferably, the heating temperature is within a range of 600° C.±50° C. Thus, a state shown in FIG. 1B is obtained.

In this state, the glass substrate 101 is surrounded by the silicon oxide film 102. That is, the silicon oxide film 102 is deposited on the exposed surrounding surface of the glass substrate.

Precisely speaking, the silicon oxide film 102 is not deposited at the part holding the substrate, so that the glass substrate is not completely surrounded by the silicon oxide film. However, an area of that region may be reduced by holding the substrate by the edge thereof.

It is important to keep the area of the region which contacts with the substrate holder and where no film is deposited to be within 5% of the whole surface area.

The glass substrate 101 surrounded by the silicon oxide film 102 deposited by means of the reduced pressure thermal CVD is useful as a substrate of a semiconductor device because the substrate is surrounded by the silicon oxide film and no impurity diffuses from the substrate in fabricating the semiconductor device.

After obtaining the state shown in FIG. 1B, an amorphous silicon film 103 is deposited so as to have a thickness of 50 nm. The amorphous silicon film 103 is deposited also on the surrounding surface of the substrate as shown in FIG. 1C in this step.

Next, the amorphous silicon film 103 is crystallized. The crystallization may be performed by means of heat treatment, irradiation of laser light, combined use of heating and irradiation of laser light or irradiation of strong light. The amorphous silicon film 103 is crystallized by using nickel element in the present embodiment.

Figure 1C:
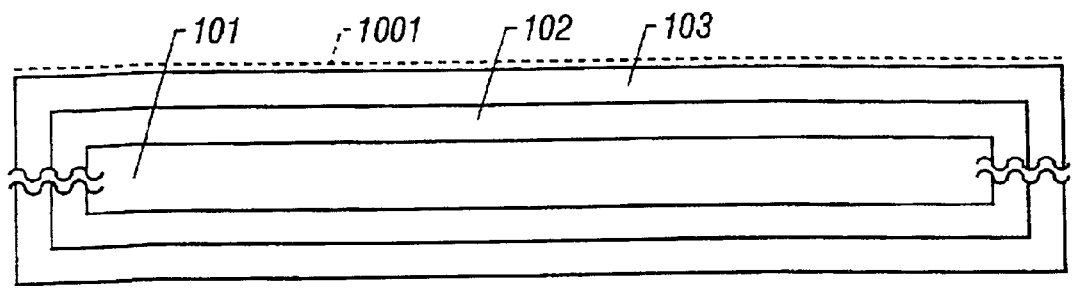

Here, a nickel acetate solution conditioned so as to have 10 ppm of concentration in terms of weight is applied at first by means of spin covering to obtain a state in which the nickel element is held in contact with the surface as shown by the reference numeral 1001 in FIG. 1C.

Figure 1D:
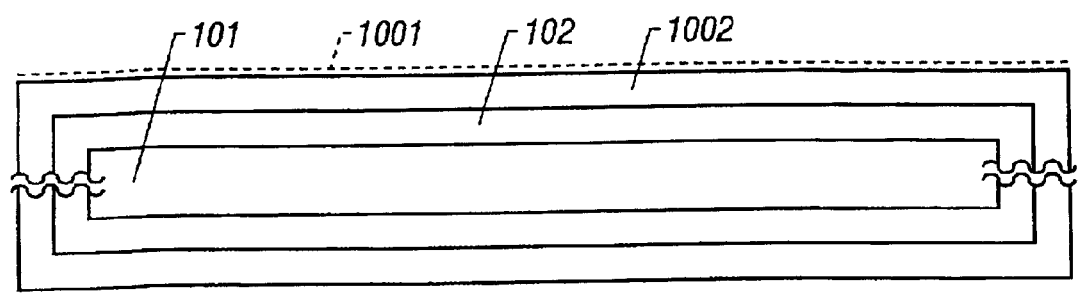

Next, the amorphous silicon film 103 is crystallized by implementing heat treatment of eight hours at 600° C. to obtain a crystallized silicon film 1002 as shown in FIG. 1D.

At this time, a region on the upper face of the substrate to which the nickel element has been introduced is selectively crystallized. The amorphous region remains as a whole in a region to which no nickel element has been introduced, though it is partly crystallized.

After obtaining the crystallized silicon film 1002, the surface is cleaned to remove the remaining nickel element.

Figure 1E:
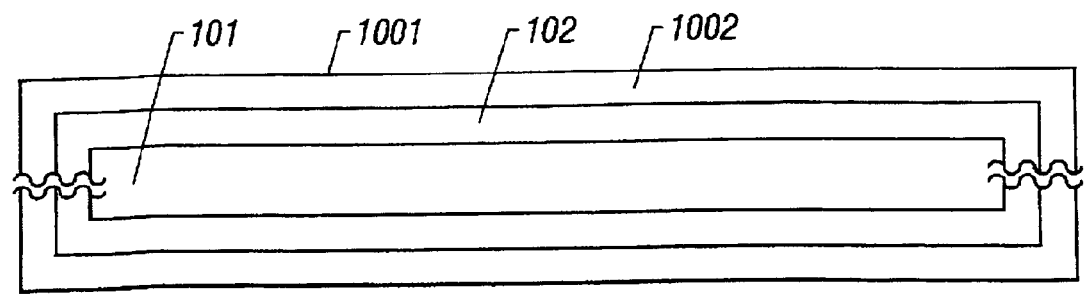

Next, a very thin oxide film is deposited on the clean surface to form a protection film. Thereby, the glass substrate is covered by the silicon oxide film 102 and the silicon oxide film 102 is covered by the crystallized silicon film 1002 thus deposited as shown in FIG. 1E.

The adoption of the arrangement described in the present embodiment allows to prevent the amorphous silicon film from being contaminated by impurity which diffuses from the glass substrate because the glass substrate is covered by the silicon oxide film at first. Then, the crystal silicon film from which impurity which had mixed into the film has been reduced may be obtained in a body with the substrate.

Second Embodiment

A case of using a quartz substrate or a crystallized glass substrate as a substrate will be shown in the present embodiment. The outline of steps for fabricating it is basically the same with that shown in FIGS. 1A through 1E.

In the present embodiment, the reduced pressure thermal CVD using $SiH_4$ and $N_2O$ as original gases is used as a method for depositing the underlying silicon oxide film.

When $SiH_4$ and $N_2O$ are used as original gases, it is preferable to set the deposition temperature at around 850° C.

The arrangement shown in the present embodiment is effective in using a lower grade quartz substrate or a crystallized glass substrate containing much impurity as the substrate.

Third Embodiment

A case of using a silicon nitride film, not a silicon oxide film, as the underlying film 102 in the arrangement shown in the first or second embodiment will be shown in the present embodiment. In this case, the reduced pressure thermal CVD is used by using $SiH_2Cl_2$ and $NH_4$ as original gases. At this time, the deposition temperature is set at 600° C. to 850° C.

According to this method, chlorine is contained within the film. Chlorine is effective in fixing movable ions and in suppressing the impurity from moving from the glass substrate.

Fourth Embodiment

A case of using a silicon oxide nitride film, not a silicon oxide film, as the underlying film 102 in the arrangement shown in the first or second embodiment will be shown in the present embodiment. In this case, the reduced pressure thermal CVD is used by using $SiH_2Cl_2$, $NH_4$ and $N_2O$ as original gases.

According to this method, chlorine is contained within the film. Chlorine is effective in fixing movable ions and in suppressing the impurity from diffusing from the glass substrate. Further, stress which acts between the glass substrate may be relaxed by introducing the oxygen component.

Fifth Embodiment

While the cases of depositing the underlying film which covers the substrate by means of the reduced pressure thermal CVD have been explained in the first through fourth embodiments described above, a case of forming a thermal oxide insulating film as an underlying film will be explained in the present embodiment.

Figure 2A:
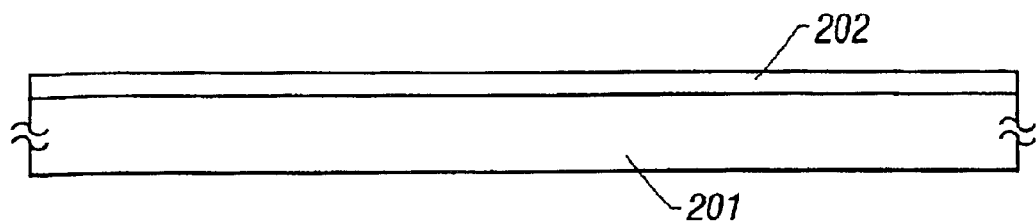
FIGS. 2A through 2C show steps for fabricating a quartz substrate on which a crystal silicon film is deposited.
Figure 2B:
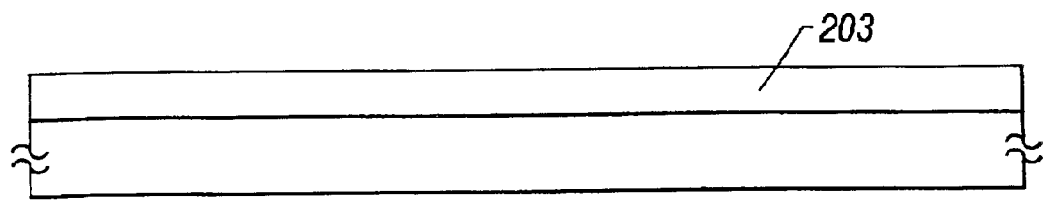
Figure 2C:
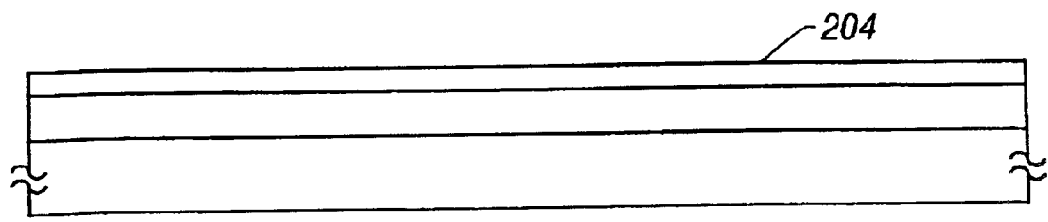

FIGS. 2A through 2C show steps for fabricating a substrate of the present embodiment. At first, an amorphous silicon film 202 which is the base of the underlying film is deposited so as to have a thickness of 30 nm on a quartz substrate 201 by means of reduced pressure thermal CVD as shown in FIG. 2A.

Although plasma CVD may be utilized as a method for depositing the amorphous silicon film 202, it is preferable to use the reduced pressure thermal CVD because the film quality becomes minuter. This is important in transforming the amorphous silicon film into a thermal oxide film later. Preferably, the thickness of the amorphous silicon film 202 is selected from a range of 10 to 50 nm.

Next, the amorphous silicon film 202 is transformed into the thermal oxide film 203 by performing heat treatment within oxygen atmosphere at 950° C. At this time, the thickness of the thermal oxide film turns out to be about 60 nm, i.e. almost twice, as shown in FIG. 2B.

It is useful to add a trace amount of halogen element within the oxygen atmosphere in forming the thermal oxide film 203 because it allows to vaporize and remove the impurity. In this case, oxygen atmosphere containing 3 vol. % of HCl may be used.

Next, an amorphous silicon film not shown is deposited on the thermal oxide film 203 by means of reduced pressure thermal CVD and is crystallized by heat treatment. Here, a crystal silicon film 204 is obtained as shown in FIG. 2C by performing the heat treatment at 850° C. for six hours within nitrogen atmosphere.

Because the minute thermal oxide film 203 has been deposited as the underlying film, it is possible to suppress impurity from diffusing or OH groups in particular from moving from the quartz substrate 201 at this time.

The arrangement shown in the present embodiment allows to suppress adverse effects from appearing in the characteristic of the TFT due to the OH groups within the quartz substrate 201 because the thermal oxide film 203 having the minute film quality has been formed on the quartz substrate 201 as the underlying film.

Then, the present embodiment allows a TFT having high characteristic and high reliability, a circuit using such a TFT or an apparatus using such a TFT to be obtained even when a low grade quartz substrate having high concentration of OH groups is used. Although the quartz substrate has been used in the present embodiment, a substrate such as a crystallized glass substrate which can sustain the thermal oxidizing temperature may be used.

Sixth Embodiment

The present embodiment relates to a method obtained by improving the fabrication method of the underlying film shown in FIGS. 2A and 2B to obtain higher reliability.

The method of the present embodiment for fabricating the amorphous silicon film which is the starting film of the underlying film is characterized in that the amorphous silicon film is deposited also on the back of the substrate by using the reduced pressure thermal CVD and by devising a method for holding the substrate during the deposition.

Figure 3A:
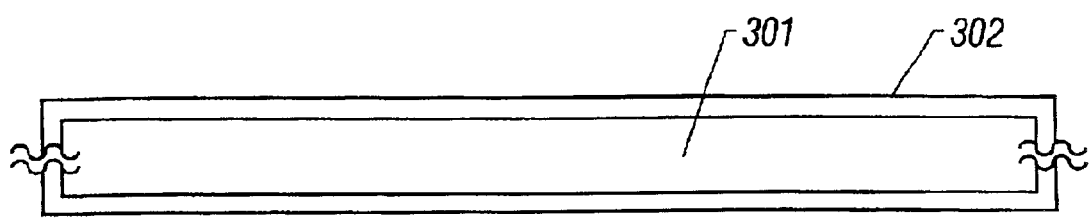
FIGS. 3A and 3B show steps for fabricating an underlying film on a quartz substrate.
Figure 3B:
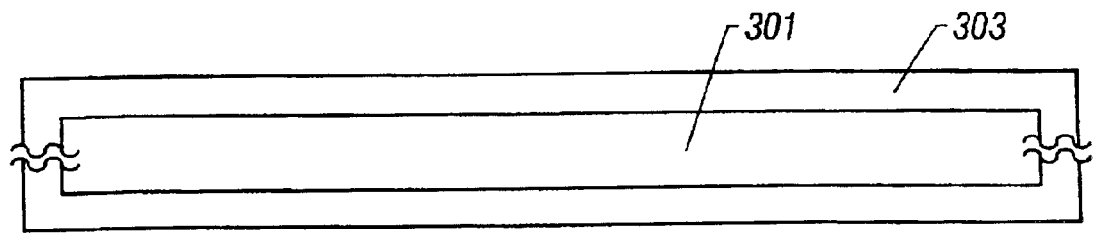

FIGS. 3A and 3B show fabrication steps of the present embodiment. At first, a high heat resistant substrate such as a quartz substrate or a crystallized glass substrate is prepared. Here, a quartz substrate 301 is used. Next, an amorphous silicon film 302 is deposited by means of reduced pressure thermal CVD while holding the substrate so as to expose the surface and the back of the substrate as shown in FIG. 3A.

At this time, the amorphous silicon film 302 is deposited also on the back of the substrate. Although it is not deposited at the edge of the substrate because the substrate is held by that, its rate is very small.

Next, the amorphous silicon film 302 is transformed into a thermal oxide film by means of thermal oxidation. Here, heat treatment at 950° C. is performed within atmosphere of 100% of oxygen while holding the substrate 301 in the same condition with the case of depositing the amorphous silicon film 302. The amorphous silicon film 302 is transformed into the thermal oxide film 303 in this step as shown in FIG. 3B.

It is useful to add a trace amount of halogen element within the oxygen atmosphere in forming the thermal oxide film 303 because it allows to vaporize and remove the impurity. In this case, oxygen atmosphere containing 3 vol. % of HCl may be used. Thereafter, a TFT may be fabricated following the known fabrication steps.

Seventh Embodiment

The present embodiment shows steps for fabricating a crystal silicon film which allows a very high electric characteristic to be obtained when a device is formed by using a high heat resistant insulating substrate such as a quartz substrate and a crystallized glass substrate as a substrate.

Figure 4A:
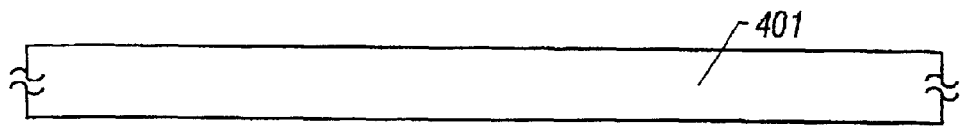
FIGS. 4A through 4F show steps for fabricating a glass substrate on which a crystal silicon film is deposited.

FIGS. 4A through 4F show the fabrication steps of the present embodiment. At first, a quartz substrate 401 is prepared as shown in FIG. 4A.

Figure 4B:
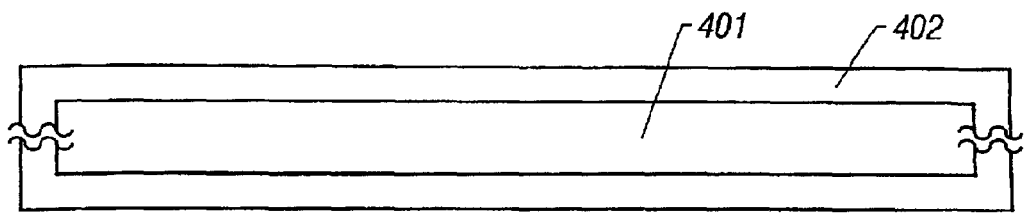

Next, a silicon oxide film is deposited so as to have a thickness of 250 nm by means of reduced pressure thermal CVD as shown in the first and second embodiments. Here, the silicon oxide film 402 is deposited by using $SiH_4$ and $NO_2$ as original gases at 850° C. as shown in FIG. 4B. Or, it is possible to obtain a quartz substrate covered by a thermal oxide film by adopting the fabrication steps shown in FIGS. 3A and 3B.

Figure 4C:
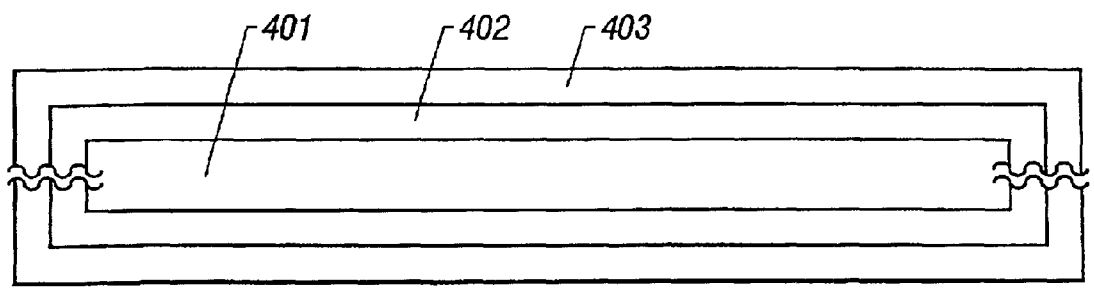

Next, an amorphous silicon film 403 is deposited so as to have a thickness of 50 nm by means of reduced pressure thermal CVD as shown in FIG. 4C. Although the silicon film is crystallized by using nickel element in the present embodiment similarly to the first embodiment, a method how to introduce the nickel element is different from the first embodiment.

Figure 4D:
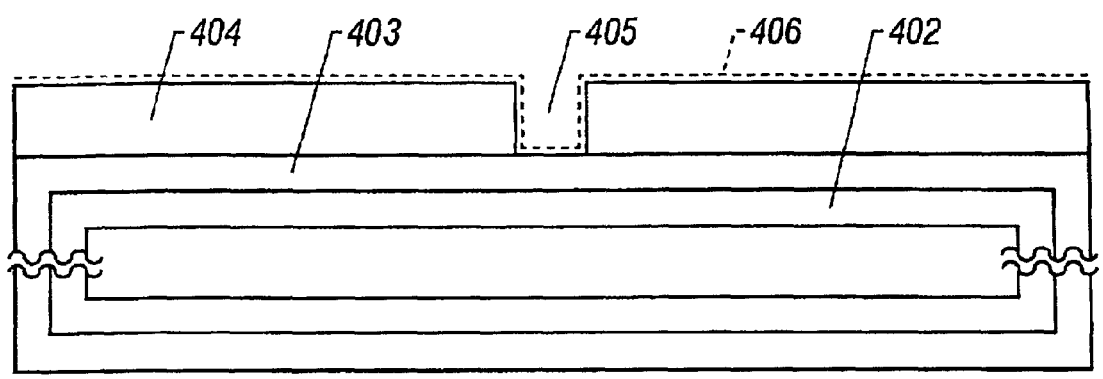

At first, a mask 404 made of a silicon oxide film is formed as shown in FIG. 4D. An opening 405 is provided on the mask 404.

Next, a nickel acetate solution conditioned so as to have 100 ppm of nickel concentration in terms of weight is applied and extra solution is removed by means of spin covering. Thus, a state in which the nickel element is held in contact with the surface as shown by the reference numeral 406 is obtained.

Figure 4E:
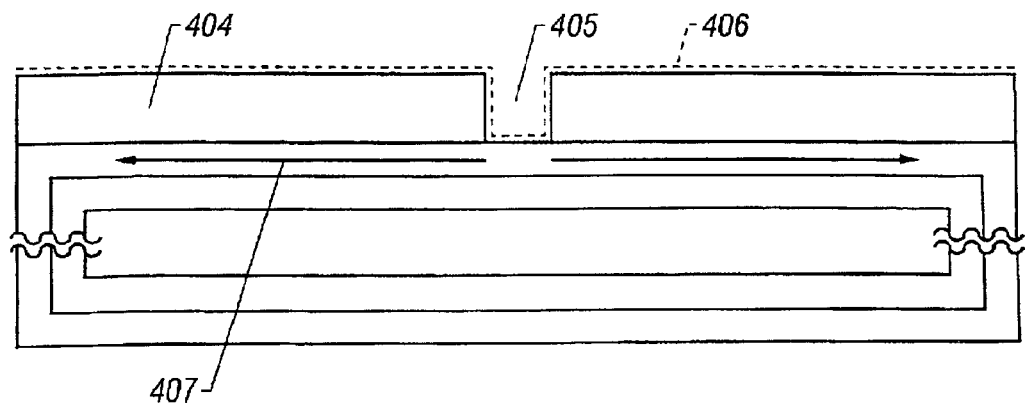
Figure 4F:
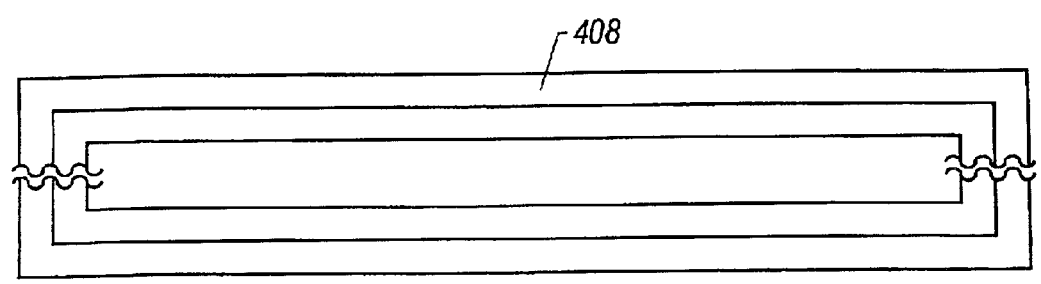

Next, 18 hours of heat treatment at 560° C. is implemented within nitrogen atmosphere. In this step, as shown in FIG. 4E, the crystal grows in the direction parallel to the substrate (direction parallel to the face of the film) as indicated by arrows 407 from a region of the opening 405. This crystal growth will be referred to as lateral growth hereinafter.

Next, the mask 404 made of the silicon oxide film is removed. Then, 30 minutes of heat treatment at 950° C. is implemented within oxygen atmosphere at normal pressure containing 3 vol. % of HCl. In this step, nickel combines with chlorine within the silicon film 408, becoming nickel chloride and being vaporized and removed in the atmosphere. Further, a thermal oxide film not shown is deposited so as to have a thickness of 30 nm around the exposed surface of the silicon film 408 in this step. As a result, the thickness of the silicon film 408 is reduced by 15 nm to be 35 nm.

The heat treatment is implemented within the oxidizing atmosphere to 1) remove the nickel element from the silicon film and 2) improve the crystallinity of the silicon film.

Especially, the effect of improvement of the crystallinity is remarkable. In concrete, a difference of more than 10 times of operating frequency can be seen between the characteristic of a TFT using a film not treated by heat in the above-mentioned oxidizing atmosphere and that of a TFT using a film treated by heat within the oxidizing atmosphere.

Thus, the quartz substrate on which the crystal silicon film has been deposited around which the thermal oxide film of 30 nm has been deposited may be obtained. The thermal oxide film functions as a blocking layer for preventing the silicon film from being contaminated.

It is preferable to put the substrate in this state to handle as an industrial product. Because the surface thereof is covered by the thermal oxide film, the silicon film will not be contaminated in handling it. In using it, the thermal oxide film on the surface thereof is removed and a device such as a TFT may be fabricated by using the silicon film thereafter.

It is noted that a silicon oxide film deposited by means of plasma CVD may be deposited as a blocking layer. In this case, the silicon oxide film may be deposited on the surface utilized for forming the device (hereinafter defined as a main face) by means of plasma CVD. Further, a silicon nitride film or a silicon oxide nitride film may be utilized as the blocking layer.

When the TFT is fabricated following fabrication steps shown in an ninth embodiment described later, while a ring oscillator fabricated by the TFT thus obtained may be caused to oscillate on a level of about 50 MHz when no heat treatment in the halogen atmosphere shown in the present embodiment is implemented, a ring oscillator thus obtained may be caused to oscillate by 10 times or more of that by implementing the heat treatment in the halogen atmosphere.

Eighth Embodiment

The present embodiment relates to a method for fabricating a glass substrate on which an amorphous silicon film is deposited. The present embodiment will be explained below with reference to FIGS. 1A through 1E.

At first a glass substrate 101 is prepared and a silicon oxide film 102 is deposited around the surface thereof by means of reduced pressure thermal CVD as shown in FIG. 1B.

Next, an amorphous silicon film 103 is deposited by means of reduced pressure thermal CVD as shown in FIG. 1C. It is desirable to deposit those films by a consecutive deposition method in which the deposition is implemented without exposing to the outside atmosphere.

In the state shown in FIG. 1C, a silicon oxide film is deposited as a blocking layer on the face (this will be defined as a main face) of the amorphous silicon film 103 used at least as a device. This silicon oxide film functions as a protection film. A silicon nitride film, a silicon oxide nitride film and the like may be used as the blocking layer.

Here, the reduced pressure thermal CVD is used again so as to cover the amorphous silicon film 103 around the surface thereof by the silicon oxide film.

Ninth Embodiment

A system which allows the silicon oxide film 102 and the amorphous silicon film 103 shown in FIG. 1 to be continuously deposited will be described in the present embodiment.

Figure 5:
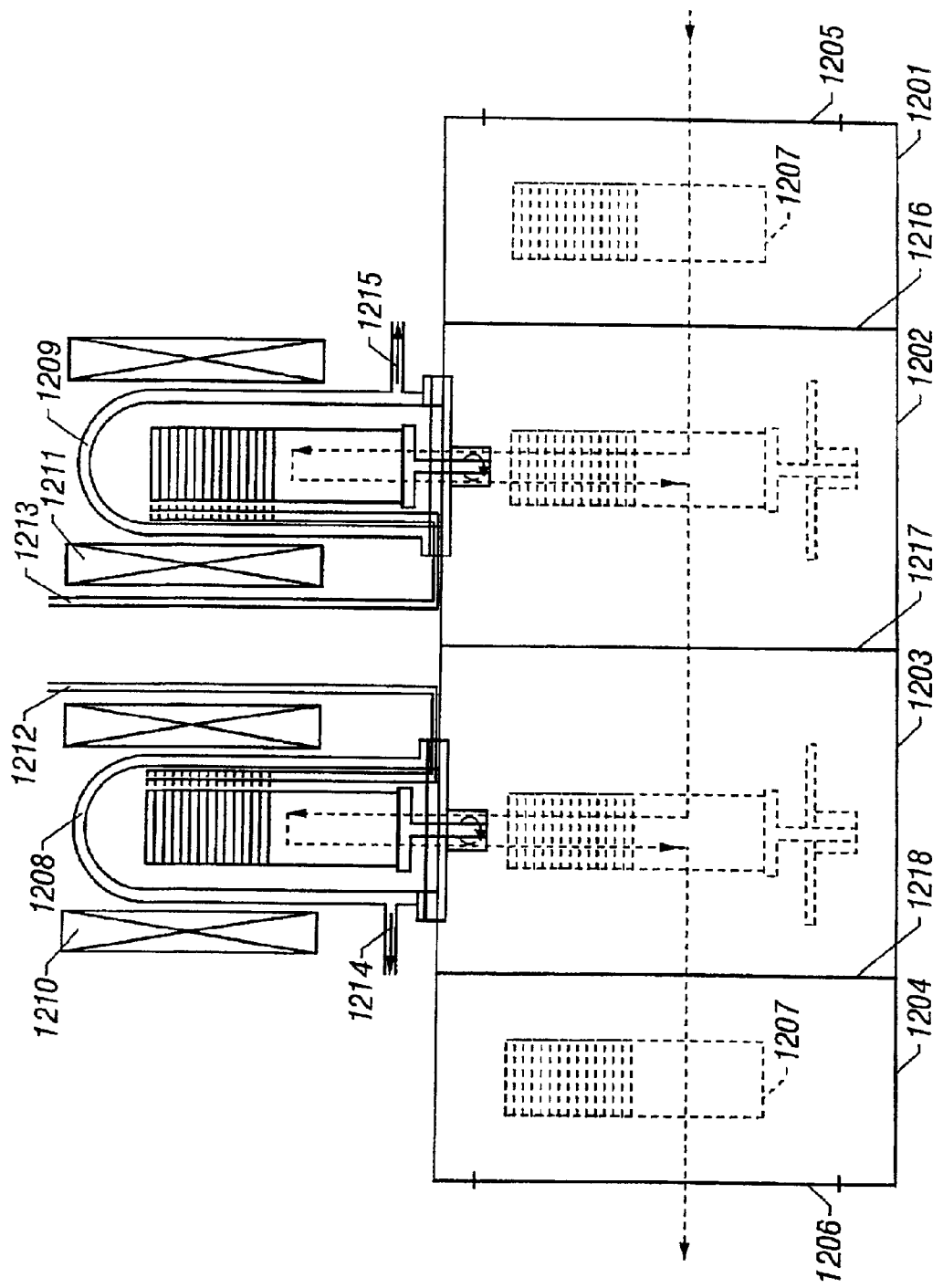
FIG. 5 shows an outline of a low pressure thermal CVD system.

FIG. 5 shows a low pressure thermal CVD system of the present embodiment. This system allows a silicon oxide film and an amorphous silicon film to be deposited continuously without exposing the outside air.

An outline of the operation will be described below. At first, a cassette 1207 in which a number of substrates are stored is carried into a carry-in chamber 1201. Nothing is deposited on the surface of the glass substrate 101 at this stage. That is, the glass substrate is in the state shown in FIG. 1A.

The carry-in chamber 1201 is isolated from the outside by a door 1205. It also comprises a gas introducing system and an exhausting system not shown independently so as to be able to control atmosphere.

The cassette 1207 carried into the carry-in chamber 1201 is transferred to a first transfer chamber 1202. The carry-in chamber 1201 is also blocked from the transfer chamber 1202 by a door 1216.

The cassette transferred to the transfer chamber 1202 is then carried into a reaction furnace 1209 formed of quartz. In the reaction furnace 1209, the silicon oxide film 102 is deposited around the surface of the glass substrate 101 by means of reduced pressure thermal CVD.

It is noted that no film is deposited at the part where the cassette 1207 contacts with the substrate 101. However, the area where no film is deposited may be minimized by holding the substrate by the edge thereof.

The deposition is performed to the number of glass substrates disposed within the cassette 1207 in the same time.

The reaction furnace 1209 is heated by a heater 1211. There are also provided a system 1213 for supplying required reaction gases and an exhaust system 1215 for realizing a low pressure state.

After finishing the deposition in the reaction furnace 1209, the cassette 1207 is returned to the first transfer chamber 1202 and is transferred further to a second transfer chamber 1203. A door 1217 is disposed between the first transfer chamber 1202 and the second transfer chamber 1203 so as to be able to separate the atmosphere of the two chambers as necessary.

Next, the cassette is transferred from the second transfer chamber 1203 to a reaction furnace 1208 to deposit the amorphous silicon film. At this time, no impurity diffuses from the region where no silicon oxide film has been deposited in the previous step because the substrate is not taken out of the cassette.

Thus, the amorphous silicon film 103 shown in FIG. 1C is deposited. The reaction furnace 1208 is also heated by a heater 1210. There are also provided a system 1212 for supplying required reaction gases and an exhaust system 1214 for realizing a low pressure state.

The glass substrates on which the silicon oxide film and the amorphous silicon film have been thus deposited are transferred to a carry-out chamber 1204 per each cassette 1207.

The second transfer chamber 1203 is partitioned from the carry-out chamber 1204 by an air-tight door 1218. The series of operation is completed by carrying out the cassette 1207 to the outside from the door 1206.

Tenth Embodiment

A method for fabricating a TFT by using the crystal silicon film formed on the substrate covered by the underlying film as shown in the first embodiment and others will be described in the present embodiment. FIGS. 6A through 6G show fabrication steps of the present embodiment.

At first, a Corning 1737 glass substrate 601 is prepared. Next, a silicon oxide film 602 (strictly speaking, it contains nitrogen) is deposited so as to have a thickness of 300 nm by means of reduced pressure thermal CVD by using $SiH_4$ and $NO_2$ as original gases.

Next, an amorphous silicon film is deposited so as to have a thickness of 50 nm by means of reduced pressure thermal CVD by using $Si_2H_6$ as original gas and is crystallized. Then, a resist mask not shown is disposed to pattern the crystal silicon film obtained in the previous step by means of wet etching. Thereby, patterns 604 and 605 are obtained.

Next, a silicon oxide film 606 which composes a gate insulating film is deposited so as to have a thickness of 50 nm by means of reduced pressure thermal CVD. This silicon oxide film 606 is also deposited by means of reduced pressure thermal CVD by using $SiH_4$ and $NO_2$ as original gases.

In the process up to this step, no plasma process using high frequency power is used. An exposed face of the glass substrate is covered by the silicon oxide film 602, except of the region in contact with the holder.

Emission of impurity from the glass substrate caused by impingement of accelerated ions may be suppressed by not using the plasma process. In addition to that, the emission of impurity from the glass substrate may be suppressed further by covering the glass substrate by the silicon oxide film.

Accordingly, it is possible to suppress the impurity from the substrate from turning around to the surface of the silicon film patterns 604 and 605 or to the surface of the silicon oxide film 606.

Figure 6A:
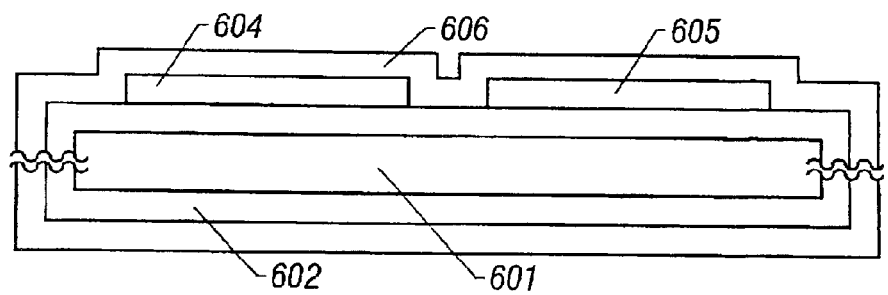
FIGS. 6A through 6G show steps for fabricating a TFT.
Figure 6B:
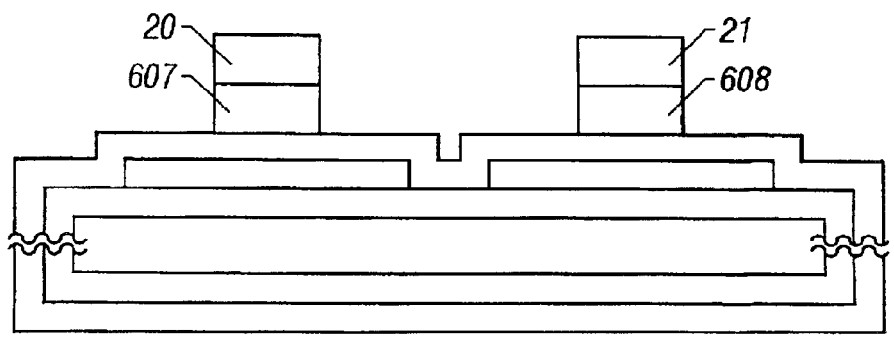

After obtaining the state shown in FIG. 6A, an aluminum film not shown is deposited so as to have a thickness of 400 nm by means of sputtering. Then, the aluminum film is patterned by using resist masks 20 and 21 to obtain patterns 607 and 608 as shown in FIG. 6B. A gate electrode of the TFT is formed based on the patterns 607 and 608.

After obtaining the state shown in FIG. 6B, anodization is implemented while leaving the resist masks 20 and 21. Here, porous anodic oxide films 609 and 612 are deposited by means of anodization using an aqueous solution containing 3% of oxalic acid as an electrolyte. Here, a distance of the growth is set at 400 nm.

The anodization proceeds selectively on the side of the aluminum patterns because there remain the resist masks 20 and 21 on the aluminum patterns.

Next, another anodization is implemented after removing the resist masks 20 and 21. Here, the anodization is implemented by using an ethylene glycol solution containing 3% of tartaric acid neutralized by aqueous ammonia as an electrolyte. In this step, anodic oxide films 610 and 613 are formed because the electrolyte infiltrates to the porous anodic oxide films.

The anodic oxide films 610 and 613 have minute film quality. It is noted that the thickness of the anodic oxide films 610 and 613 is 70 nm.

Figure 6C:
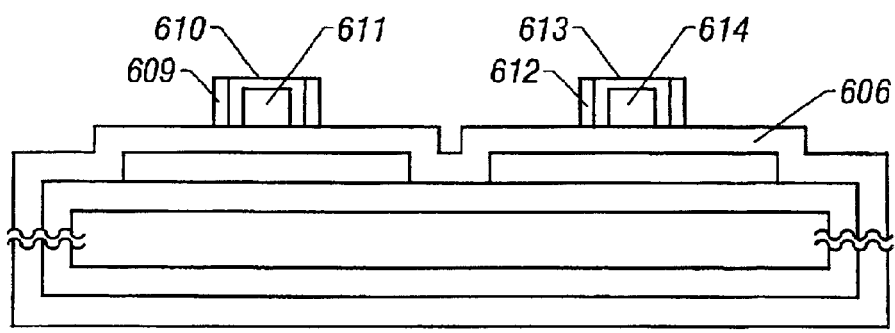

Thus, a state shown in FIG. 6C is obtained. Next, the silicon oxide film 606 exposed on the upper face is removed by means of dry etching having a vertical anisotropy. Further, the porous anodic oxide films 609 and 612 are removed.

Figure 6D:
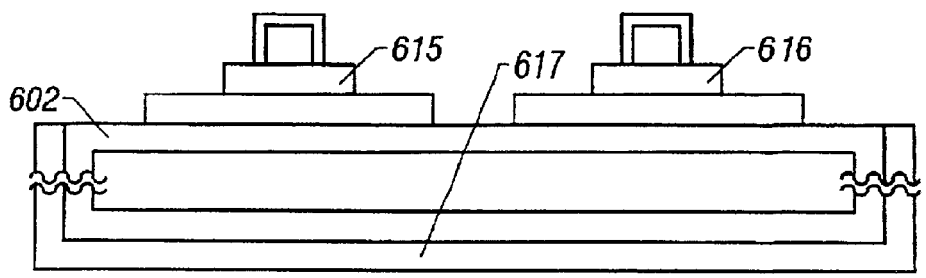

Thus, a state shown in FIG. 6D is obtained. In the state shown in FIG. 6D, the silicon oxide film composing a gate insulating film 617 is left on the back of the substrate. Further, the silicon oxide films which compose gate electrodes 615 and 616 are left.

Next, impurity element for forming source and drain regions is doped by means of plasma doping. Here, two TFT regions are masked by a resist mask alternately to dope P (phosphorus) and B (boron), respectively.

A source region 618 and a drain region 622 of a PTFT (P channel type thin film transistor) are formed in a manner of self-alignment by implementing the doping. A source region 627 and a drain region 623 of a NTFT (N channel type thin film transistor) are also formed in a manner of self-alignment as shown in FIG. 6E.

At this time, lightly doped regions 619, 621, 624 and 626 are formed in a manner of self-alignment because there exist the remaining silicon oxide films 615 and 616. The regions 619 and 621 turn out to be low concentrate impurity regions where the doped boron is less concentrated as compared to the regions 618 and 622. The regions 624 and 626 turn out to be low concentrate impurity regions where the doped phosphorus is less concentrated as compared to the regions 623 and 627.

After finishing the doping, laser light is irradiated to activate the doped regions. This step may be implemented also by irradiating strong light such as infrared rays and ultraviolet rays.

Figure 6E:
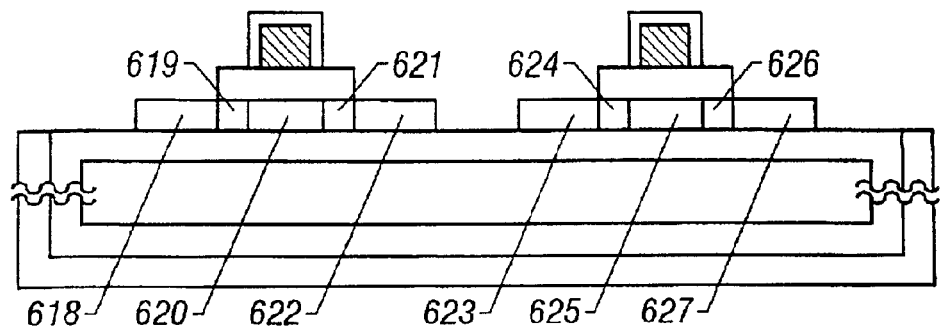

After obtaining the state shown in FIG. 6E, a silicon oxide film 628 is deposited so as to have a thickness of 300 nm by means of plasma CVD. Further, a silicon nitride film 629 is deposited so as to have a thickness of 50 nm. Still more, a polyimide resin film 630 is deposited by means of spin covering. Thus, a state shown in FIG. 6F is obtained.

Beside the polyimide, polyamide, polyimide-amide, acryl, epoxy and the like may be used.

Figure 6F:
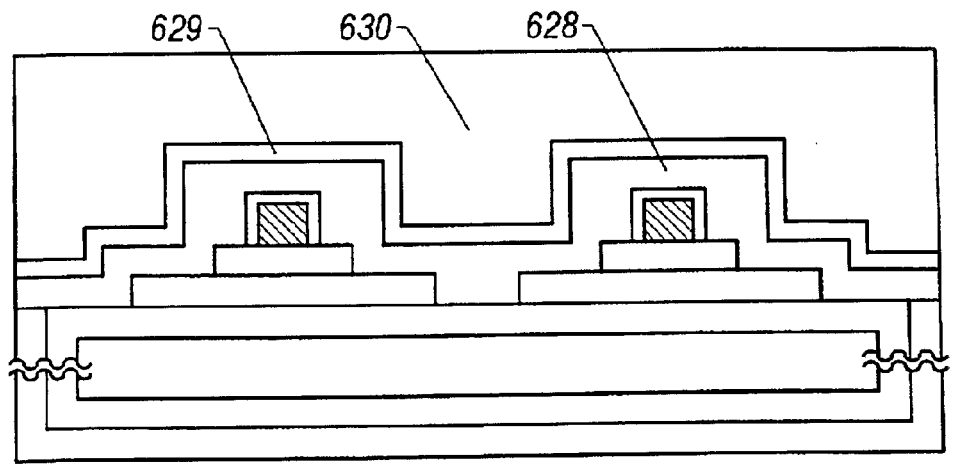
Figure 6G:
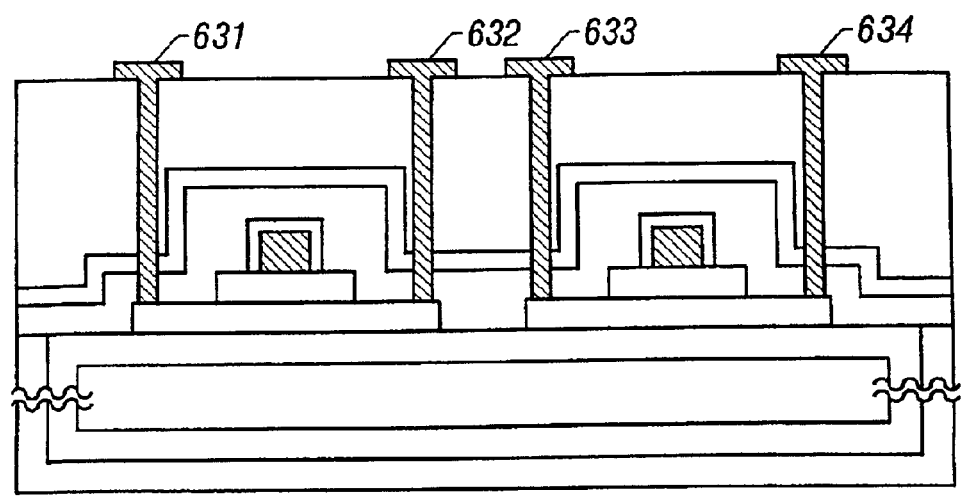

After obtaining the state shown in FIG. 6F, contact holes are created to form a source electrode 631 and a drain electrode 632 of the PTFT and a source electrode 634 and a drain electrode 633 of the NTFT. Thus, a state shown in FIG. 6G is obtained. Here, a CMOS structure may be obtained by connecting the drain electrodes 632 and 633.

The adoption of the fabrication steps of the present embodiment allows to suppress the impurity from the glass substrate from turning around between the gate insulating film and the gate electrode and to reduce the variation of the characteristic of the TFT thus obtained.

It also allows to suppress the impurity from the glass substrate from turning around to the part between the active layer and the gate insulating film. Thereby, the reliability of the device thus obtained may be improved.

Although the case of using aluminum as the material composing the gate electrode has been shown in the present embodiment, various silicides, silicon having an electrical conductive type or various metallic materials may be used as the material composing the gate electrode.

Eleventh Embodiment

The present embodiment is a case of depositing the silicon oxide film 606 which functions as a gate insulating film (see FIG. 6A) by means of plasma CVD, not by means of reduced pressure thermal CVD, in the fabrication steps shown in the tenth embodiment.

Figure 7A:
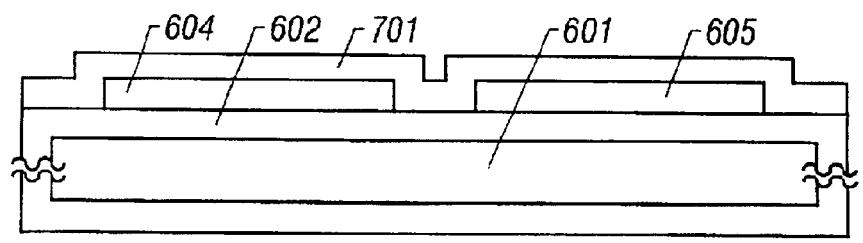
FIGS. 7A through 7D show steps for fabricating a TFT.

FIGS. 7A through 7D show the fabrication steps of the present embodiment. As shown in FIG. 7A, the silicon oxide film is deposited on the surface (upper, bottom and side faces) of a glass substrate 601 by means of reduced pressure thermal CVD following the fabrication steps shown in the first embodiment. Then, patterns 604 and 605 formed of a crystal silicon film are formed.

In this state, a silicon oxide film 701 which functions as a gate insulating film is deposited so as to have a thickness of 20 to 150 nm (e.g. 100 nm) as shown in FIG. 7A.

Here, it is feared that impurity turns around from the glass substrate due to plasma damage as compared to the case of the first embodiment when the silicon oxide film 701 is to be deposited by means of plasma CVD. However, the glass substrate 601 is covered as if it is wrapped by the silicon oxide film 602 also in the present embodiment, practically it is possible to suppress impurity from turning around from the substrate.

Figure 7B:
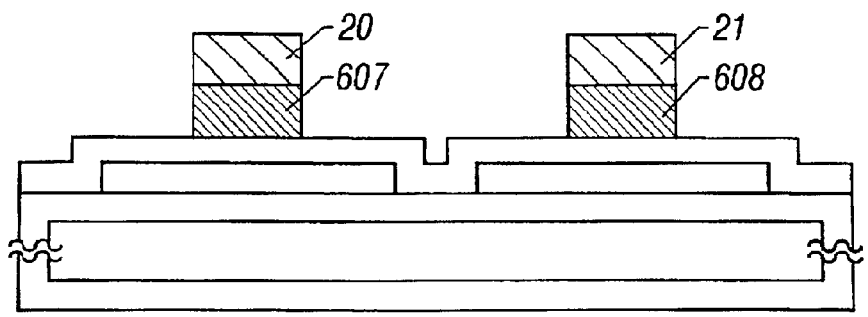

After obtaining the state shown in FIG. 7A, an aluminum film is patterned by utilizing resist masks 20 and 21 to obtain aluminum patterns 607 and 608 as shown in FIG. 7B.

Figure 7C:
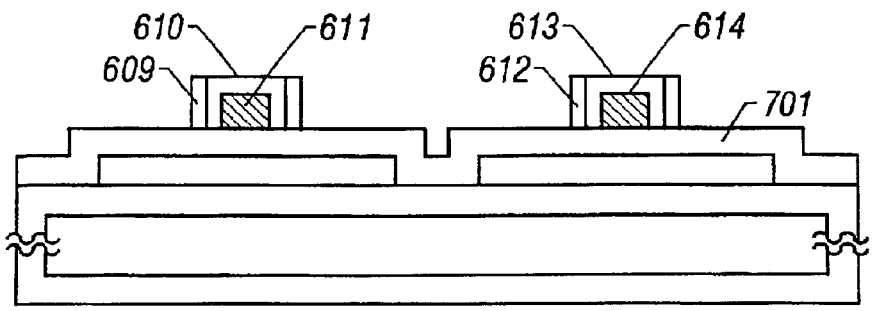
Figure 7D:
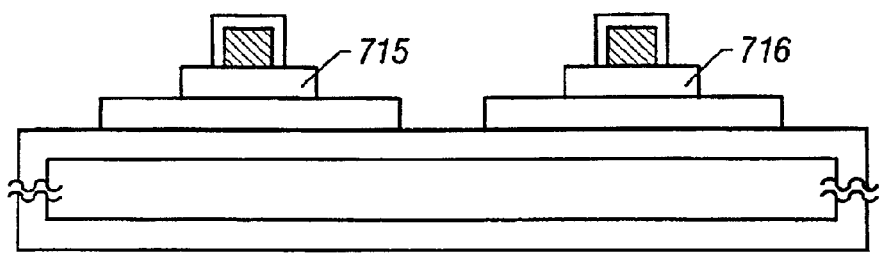

Next, porous anodic oxide films 609 and 612 are formed while leaving the resist masks 20 and 21 by means of anodization. Then, the resist masks 20 and 21 are removed to form anodic oxide films 610 and 613 having minute film quality as shown in FIG. 7C.

Next, the exposed silicon oxide film 701 is removed. The remaining silicon oxide films 715 and 716 turn out to be gate insulating films. Further, the porous anodic oxide films 609 and 612 are removed, thus obtaining a state shown in FIG. 7D.

Thereafter, a PTFT (P channel type thin film transistor) and a NTFT (N channel type thin film transistor) are fabricated following the same steps with those shown in FIGS. 6E through 6G.

Twelfth Embodiment

A case of fabricating an inversely staggered TFT by using the invention disclosed in the present specification will be described in the present embodiment.

Figure 8A:
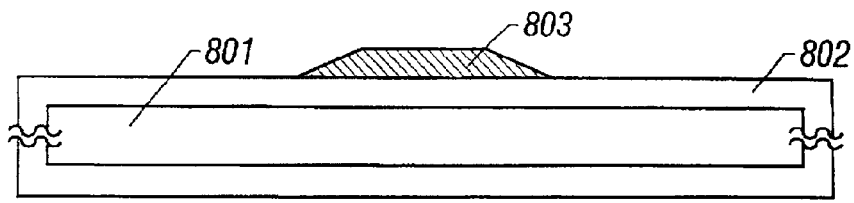
FIGS. 8A through 8E show steps for fabricating a TFT.

FIGS. 8A through 8E show fabrication steps of the present embodiment. At first, as shown in FIG. 8A, a silicon oxide film 802 is deposited on the whole surface of an exposed glass substrate 801 by means of reduced pressure CVD.

Next, a gate electrode 803 made of a silicide material is formed. Here, the gate electrode 803 is formed by using tungsten silicide deposited by means of sputtering. Thus, a state shown in FIG. 8A is obtained.

While the sputtering is used in forming the gate electrode 803, it is possible to suppress impurity from diffusing due to the sputtering of the substrate because the substrate is covered by the silicon oxide film.

Next, a silicon oxide film 804 which functions as a gate electrode is deposited by means of reduced pressure thermal CVD. Then, an amorphous silicon film 805 is deposited by means of reduced pressure thermal CVD and is crystallized by heat treatment as shown in FIG. 8B.

Figure 8B:
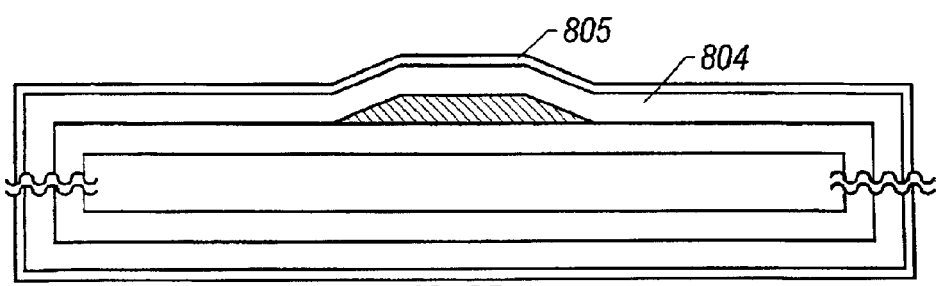
Figure 8C:
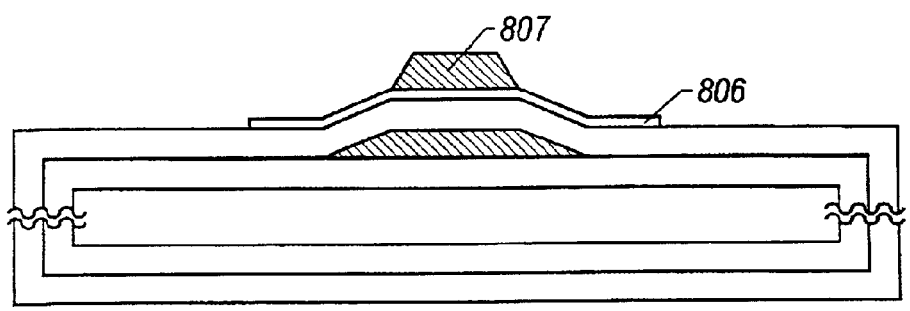

After obtaining the state shown in FIG. 8B, the silicon film is patterned to obtain a pattern 806 shown in FIG. 8C. This pattern becomes an active layer of a TFT.

Next, a silicon nitride film is deposited by means of plasma CVD and is patterned to obtain a mask pattern 807 as shown in FIG. 8C.

Figure 8D:
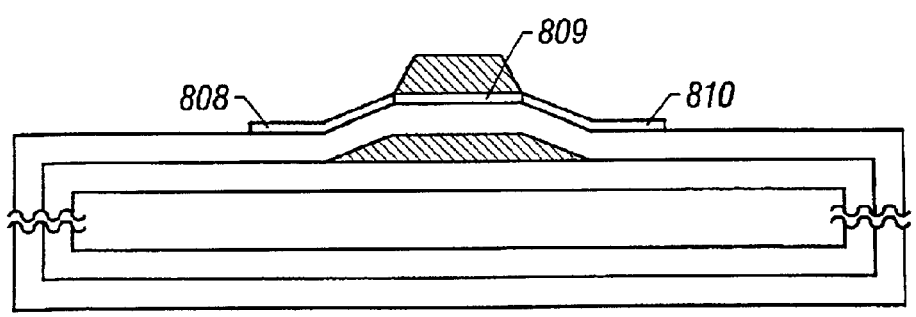

Next, a source region 808, a drain region 810 and a channel region 809 are formed in a manner of self-alignment by doping phosphorus ions by means of plasma doping as shown in FIG. 8D.

After finishing the doping, laser light is irradiated to activate the doped phosphorus and to anneal the crystal structure damaged during the doping.

Figure 8E:
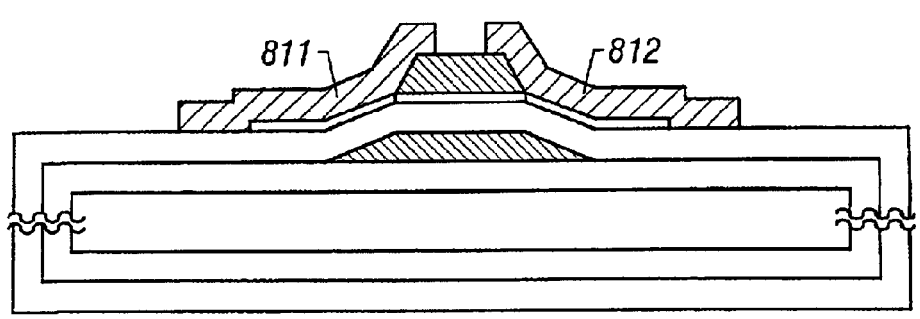

Next, a source electrode 811 and a drain electrode 812 are formed by a laminated film of a titanium film, an aluminum film and a titanium film as shown in FIG. 8E. Thus, a bottom gate type TFT is completed.

The points of the fabrication steps described above lie in that:

(1) impurity is suppressed from emitting from the glass substrate 801 in the later steps by arranging so as to cover the glass substrate 801 by the underlying film 802; and (2) the underlying film 802, the silicon oxide film 804 which functions as the gate insulating film and the amorphous silicon film 805 which is a starting film for forming the active layer later are deposited respectively by means of reduced pressure thermal CVD to reduce plasma damage in depositing them.

Such arrangement allows to suppress the impurity within the glass substrate from infiltrating to the active region of the TFT and from giving a bad influence on the operation of the TFT.

It is noted here that the active region means regions such as the surface of the active layer, the inside of the gate insulating film and the interface between the gate electrode and the gate insulating film which are electrically related sensitively to the operation of the TFT.

Thirteenth Embodiment

The present embodiment relates to fabrication steps which allow nickel element to be removed even when a glass substrate is used when a crystal silicon film is obtained by using the nickel element. FIGS. 9A through 9D show the fabrication steps of the present embodiment.

Figure 9A:
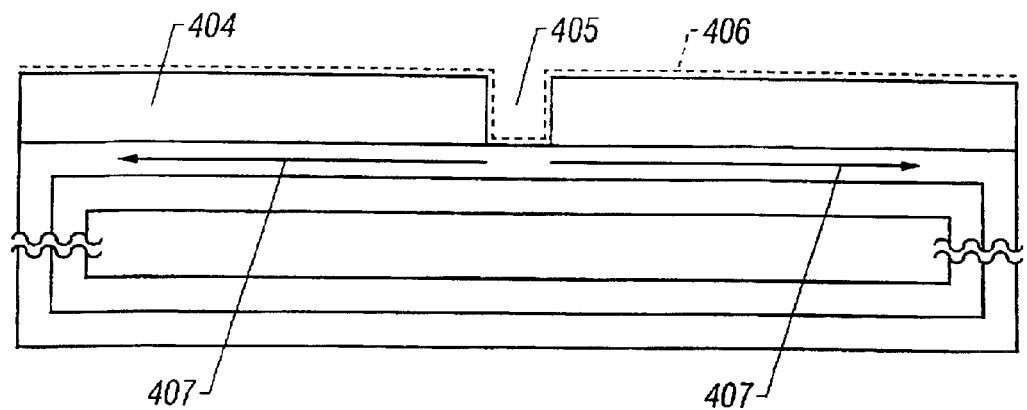
FIGS. 9A through 9D show steps for fabricating a glass substrate on which a crystal silicon film is deposited.

At first, a state shown in FIG. 9A is obtained following the fabrication steps shown in FIG. 4. Here, a glass substrate is used as a substrate. FIG. 9A shows the state in which crystal is growing as indicated by arrows 407 from a region of an opening 405 created on a mask 404.

After finishing the lateral growth, the mask 404 made of a silicon oxide film is removed and masks 901 and 902 made of a silicon oxide film are disposed.

Figure 9B:
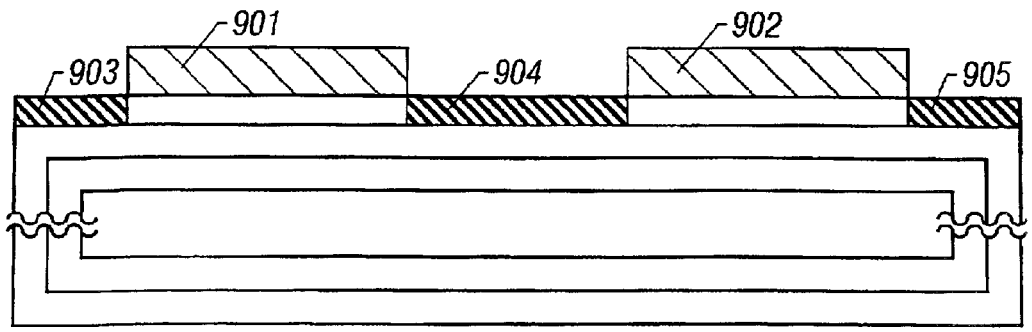

Then, phosphorus ions are accelerated and implanted by a plasma doping system. In this step, phosphorus is doped into regions 903, 904 and 905 as shown in FIG. 9B. In these regions, the crystal structure is destroyed and defects are created densely.

After obtaining the state shown in FIG. 9B, heat treatment is implemented within nitrogen atmosphere at 600 for two hours.

Figure 9C:
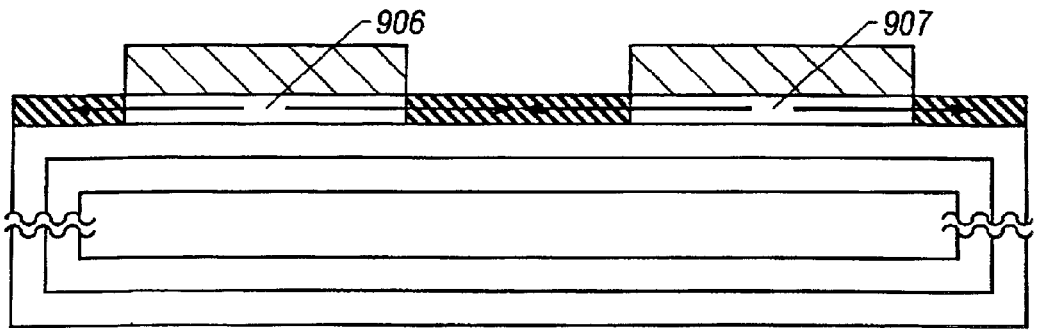
Figure 9D:
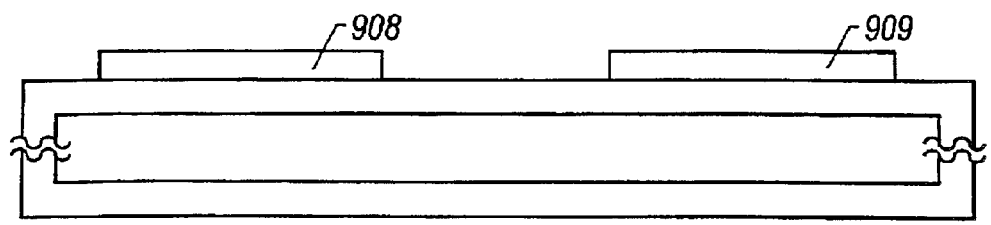
Figure 11:
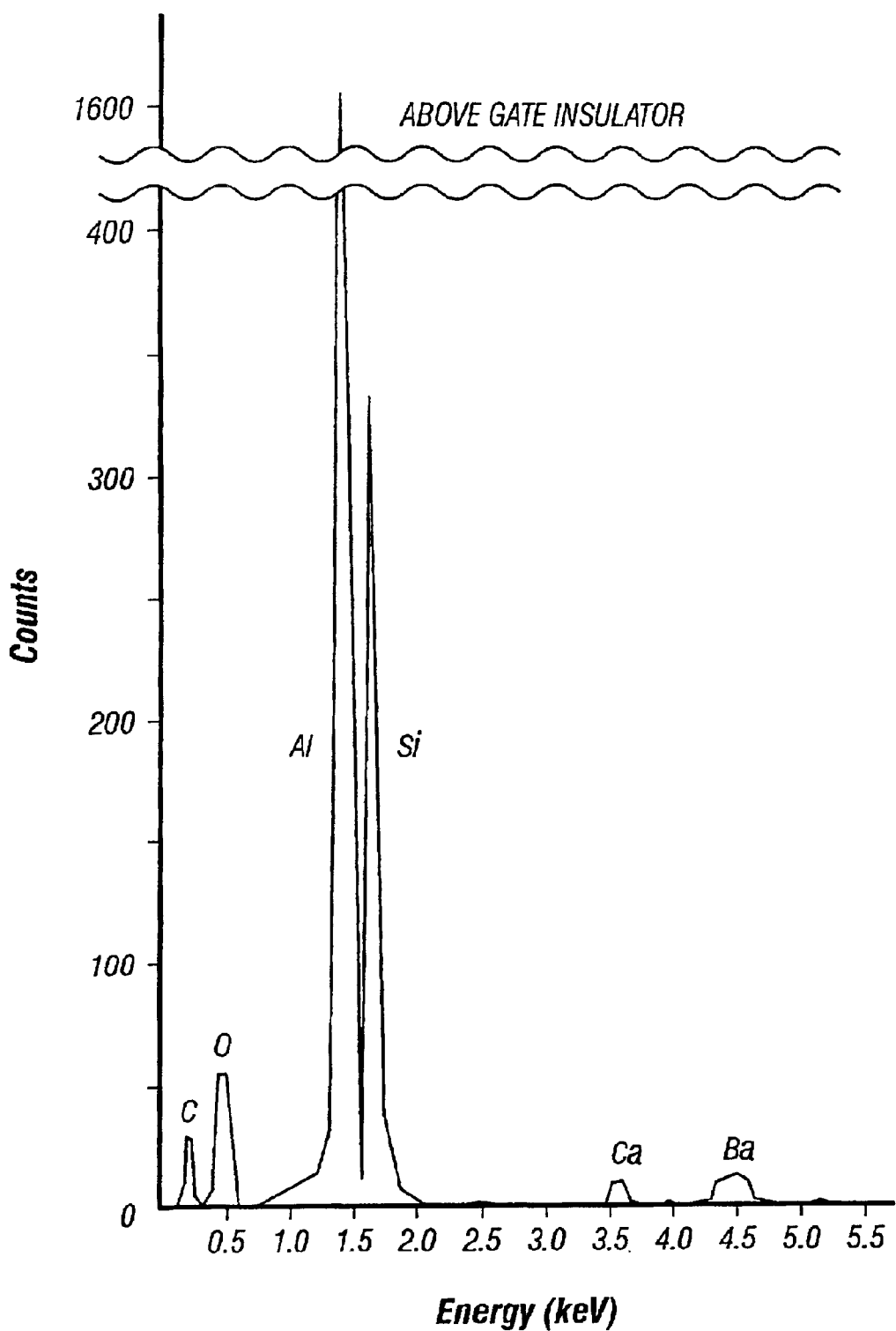
FIG. 11 is a graph showing a rate of impurity within a TFT.
Figure 12:
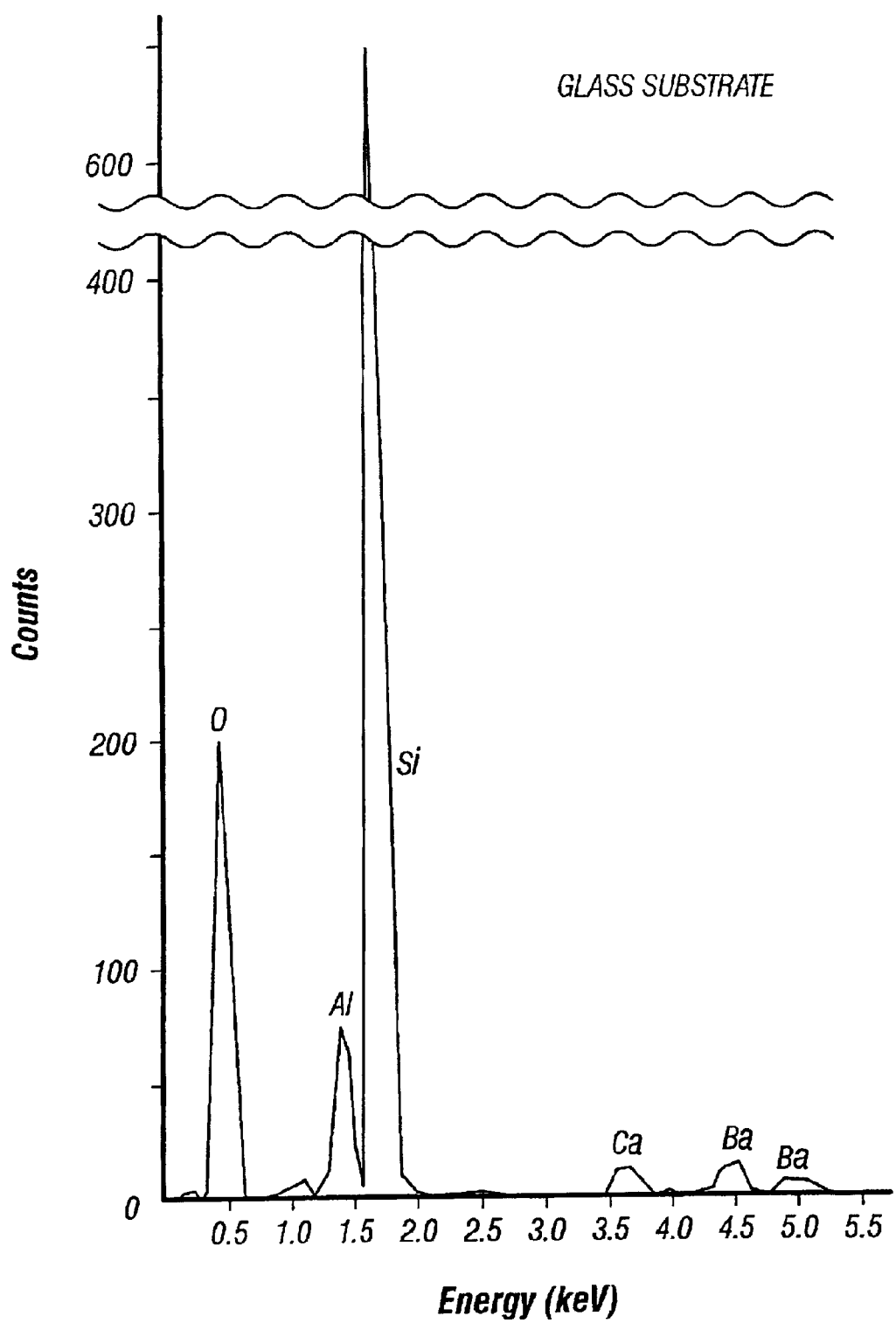
FIG. 12 is a graph showing a rate of impurity within a glass substrate.

In this step, nickel moves from regions 906 and 907 to the regions 903, 904 and 905 as shown in FIG. 9C. That is, nickel existing in the regions 906 and 907 is gettered to the regions 903, 904 and 905.

Then, the regions 903, 904 and 905 are removed. Patterns 908 and 909 are formed by using the remaining silicon film. Thus, an active layer from which the nickel element has been removed is obtained.

The fabrication step of the present embodiment requires no high temperature of 900° C. or more in order to remove nickel. Therefore, it allows the glass substrate to be used.

Fourteenth Embodiment

Various semiconductor devices using the TFT obtained by utilizing the present invention will be exemplified in the present embodiment. That is, an outline of each equipment constructed by using the TFT fabricated by utilizing the invention disclosed in the present specification will be described. FIGS. 10A through 10F show the outline of each equipment.

FIG. 10A shows a portable information processing terminal having a communication function utilizing telephone lines.

This electronic equipment comprises an integrated circuit 2006 utilizing the TFT within a main body 2001. It also comprises an active matrix type liquid crystal display 2005 in which the TFTs are disposed as switching elements, a camera section 2002 for taking in images and control switches 2004.

Such a portable information terminal as shown in FIG. 10A has a tendency to be miniaturized and thinned more and more for the future. When it is to be miniaturized and thinned, a structure in which various circuits for processing information, an oscillation circuit and the like, beside the active matrix circuit for display, are integrated on one substrate (called a system-on-panel) is required.

It is then useful to fabricate the TFTs by utilizing the invention disclosed in the present specification for such structure.

FIG. 10B shows an electronic apparatus called a head mounting display. A main body 2101 thereof is mounted on a head by a band 2103. This apparatus has a function of displaying images artificially in front of eyes. The image is displayed on an active matrix type liquid crystal display 2102 corresponding to the right and left eyes. TFTs are disposed in the active matrix section as switching elements.

FIG. 10C shows an equipment having a function of displaying geographical data and others based on signals from satellites. Information from the satellite received by an antenna 2204 is processed by an electronic circuit provided within a main body 2201 and is displayed on an active matrix type liquid crystal display 2202.

The equipment is controlled by control switches 2203. A circuit using TFTs is used also in such an equipment.

FIG. 10D shows a portable telephone. This electronic equipment comprises an antenna 2306, a voice output section 2302, a liquid crystal display 2304, control switches 2305 and voice input section 2303 on a main body 2301.

FIG. 10E shows a portable image pickup equipment called a video camera. This electronic equipment comprises a liquid crystal display 2402 and control switches 2404 mounted on an opening/closing member.

It also comprises an image receiving section 2406, an integrated circuit 2407, a voice input section 2403, control switches 2404 and a battery 2405 on a main body 2401.

FIG. 10F shows a projector type liquid crystal display. This electronic equipment comprises a light source 2502, a liquid crystal display 2503 and an optical system 2504 in a main body 2501 and has a function of projecting images on a screen 2505.

Either of a transmission type and reflection type liquid crystal display may be used as the liquid crystal display in the electronic equipments described above. The transmission type liquid crystal display is advantageous in terms of displaying characteristic and the reflection type liquid crystal display is advantageous in reducing its power consumption, miniaturizing its size and lightening its weight.

A flat panel display such as an active matrix type EL display or a plasma display may be used as the display.

As described above, the use of the invention disclosed in the present specification allows to provide the arrangement which prevents impurity from turning around from the glass substrate (or an appropriate substrate) to the TFT. Accordingly, the use of the invention disclosed in the present specification allows to obtain the arrangement for obtaining the TFT having stable characteristics.

While preferred embodiments have been described, variations thereto will occur to those skilled in the art within the scope of the present inventive concepts which are delineated by the following claims.

What is claimed is:

1. An electroluminescence display device comprising:
a substrate;
a first insulating film comprising silicon nitride covering front and rear surfaces of the substrate;
at least one semiconductor island comprising crystalline silicon formed over the first insulating film covering the front surface of the substrate;
at least one gate insulating film comprising silicon oxide formed over the semiconductor island;
at least one gate electrode formed over the gate insulating film; and
a second insulating film over the first insulating film covering the rear surface of the substrate,
wherein the second insulating film comprises a same material as the gate insulating film.

2. An electroluminescence display device according to claim 1 wherein the substrate comprising glass.

3. An electroluminescence display device according to claim 1 wherein the display device is a device selected from the group consisting of: a portable information processing terminal, a head-mounting display, a car navigation system, a portable telephone, a video camera and a projector.

4. An electroluminescence display device comprising:
a substrate;
a first insulating comprising silicon oxide containing nitrogen covering front and rear surfaces of the substrate;
at least one semiconductor island comprising crystalline silicon formed over the first insulating film covering the front surface of the substrate;
at least one gate insulating film comprising silicon oxide formed over the semiconductor island;
at least one gate electrode formed over the gate insulating film; and
a second insulating film over the first insulating film covering the rear surface of the substrate,
wherein the second insulating film comprises a same material as the gate insulating film.

5. An electroluminescence display device according to claim 4 wherein the substrate comprising glass.

6. An electroluminescence display device according to claim 4 wherein the display device is a device selected from the group consisting of: a portable information processing terminal, a head-mounting display, a car navigation system, a portable telephone, a video camera and a projector.

7. An electroluminescence display device comprising:
a substrate;
a first insulating film comprising silicon nitride covering front and rear surfaces of the substrate;
at least one semiconductor island comprising crystalline silicon formed over the first insulating film covering the front surface of the substrate;
at least one gate insulating film comprising silicon oxide formed over the semiconductor island;
at least one gate electrode formed over the gate insulating film;
a second insulating film over the first insulating film covering the rear surface of the substrate; and
a resin film formed over the at least one gate electrode,
wherein the second insulating film comprises a same material as the gate insulating film.

8. An electroluminescence display device according to claim 7, wherein the resin film comprises a material selected from the group consisting of polyimide, polyamide, polyimide-amide, acryl and epoxy.

9. An electroluminescence display device according to claim 7 wherein the substrate comprising glass.

10. An electroluminescence display device according to claim 7 wherein the display device is a device selected from the group consisting of a portable information processing terminal, a head-mounting display, a car navigation system, a portable telephone, a video camera and a projector.

11. An electroluminescence display device comprising:
a substrate;
a first insulating comprising silicon oxide containing nitrogen covering front and rear surfaces of the substrate;
at least one semiconductor island comprising crystalline silicon formed over the first insulating film covering the front surface of the substrate;
at least one gate insulating film comprising silicon oxide formed over the semiconductor island;
at least one gate electrode formed over the gate insulating film;
a second insulating film over the first insulating film covering the rear surface of the substrate; and
a resin film formed over the at least one gate electrode,
wherein the second insulating film comprises a same material as the gate insulating film.

12. An electroluminescence display device according to claim 11, wherein the resin film comprises a material selected from the group consisting of polyimide, polyamide, polyimide-amide, acryl and epoxy.

13. An electroluminescence display device according to claim 11 wherein the substrate comprising glass.

14. An electroluminescence display device according to claim 11 wherein the display device is a device selected from the group consisting of a portable information processing terminal, a head-mounting display, a car navigation system, a portable telephone, a video camera and a projector.

* * * * *